United States Patent
Lin

(10) Patent No.: US 6,406,819 B1
(45) Date of Patent: Jun. 18, 2002

(54) METHOD FOR SELECTIVE PSM WITH ASSIST OPC

(75) Inventor: Chin-Lung Lin, Kaohsiung (TW)

(73) Assignee: United Microelectronics Corp. (TW)

( * ) Notice: Subject to any disclaimer, the term of this patent is extended or adjusted under 35 U.S.C. 154(b) by 0 days.

(21) Appl. No.: 09/469,009

(22) Filed: Dec. 21, 1999

(51) Int. Cl.$^7$ .............................. G03F 9/00; G03C 5/00
(52) U.S. Cl. ........................................... 430/5; 430/311
(58) Field of Search ............................ 430/5, 311, 312, 430/313; 438/132

(56) References Cited

U.S. PATENT DOCUMENTS

| | | | | |
|---|---|---|---|---|
| 5,821,014 A | * | 10/1998 | Chen et al. ..................... | 430/5 |
| 5,965,306 A | * | 10/1999 | Mansfield et al. .............. | 430/5 |
| 6,114,095 A | * | 9/2000 | Nakabayashi et al. .......... | 430/5 |
| 6,243,855 B1 | * | 6/2001 | Kobayashi et al. ............. | 716/19 |

* cited by examiner

Primary Examiner—S. Rosasco
(74) Attorney, Agent, or Firm—Powell Goldstein Frazer & Murphy LLP

(57) ABSTRACT

A phase shift mask for photolithography used in fabricating integrated circuits is disclosed. The mask comprises a transparent plate and a first opaque film formed on said transparent plate, which has a first pattern defining a main feature region. The first pattern is then imaged onto a photoresist layer coated on a wafer for the integrated circuits. The present invention further comprises at least one phase shift region formed on said transparent plate to correspond to an active region of the wafer, in which the phase shift region is used to improve optical scattering effect of the first pattern through the active region while performing the photolithography. Moreover, the present invention comprises at least one second opaque film formed on said transparent plate to correspond to a non-active region of the wafer, in which each has at least one second pattern used to improve optical scattering effect of the first pattern through the non-active region while performing the photolithography. The second pattern is located alongside and separated from the first pattern of the opaque film, and wherein the second pattern is then imaged onto the wafer with the phase shift region and the first pattern.

32 Claims, 3 Drawing Sheets

METHOD FOR SELECTIVE PSM WITH ASSIST OPC

BACKGROUND OF THE INVENTION

1. Field of the Invention

The present invention generally relates to a VLSI circuit design method, and more particularly to a method for selective phase shift mask with assist optical proximity correction.

2. Description of the Prior Art

A very large scale integrated (VLSI) complementary metal oxide semiconductor (CMOS) chip is manufactured on a silicon wafer by a sequence of material additions (i.e., low pressure chemical vapor depositions, sputtering operations, etc.), material removals (i.e., wet etches, reactive ion etches, etc.), and material modifications (i.e., oxidations, ion implants, etc.). These physical and chemical operations interact with the entire wafer. For example, if a wafer is placed into an acid bath, the entire surface of the wafer will be etched away. In order to build very small electrically active devices on the wafer, the impact of these operations has to be confined to small, well-defined regions.

Lithography in the context of VLSI manufacturing of CMOS devices is the process of patterning openings in photosensitive polymers (sometimes referred to as photoresists or resists) which define small areas in which the silicon base (or other) material is modified by a specific operation in a sequence of processing steps. The manufacturing of CMOS chips involves the repeated patterning of photoresist, followed by an etch, implant, deposition, or other operation, and ending in the removal of the expended photoresist to make way for a new resist to be applied for another iteration of this process sequence.

The basic lithography system consists of a light source, a stencil or photomask containing the pattern to be transferred to the wafer, a collection of lenses, and a means for aligning existing patterns on the wafer with patterns on the mask. Since a wafer containing from fifty to one hundred chips is patterned, a lithography stepper is limited by parameters described in Rayleigh's equation:

$$R \times k1 * \lambda/NA$$

Where $\lambda$ is the wavelength of the light source used in the projection system and NA is the numerical aperture of the projection optics used. k1 is a factor describing how well a combined lithography system can utilize the theoretical resolution limit in practice and can range from 0.8 down to 0.5 for standard exposure systems. The highest resolution in optical lithography is currently achieved with deep ultra violet (DUV) steppers operating at 248 nm wavelength. Steppers operating at a wavelength of 356 nm are also in widespread use.

Conventional photomask consisted of chromium patterns on a quartz plate, allowing light to pass wherever the chromium is removed from the mask. Light of a specific wavelength is projected through a mask onto the photoresist coated wafer, exposing the resist wherever hole patterns are placed on the mask. Exposing the resist to light of appropriate wavelength causes modifications in the molecular structure of the resist polymers which allows a developer chemical to dissolve and remove the resist in the exposed areas. (Conversely, negative resist systems allow only unexposed resist to be developed away.) The photomask, when illuminated, can be pictured as an array of individual, infinitely small light sources, which can be either turned on (points covered by clear areas) or turned off (points covered by chrome).

These conventional photomasks are commonly referred to as chrome on glass (COG) binary masks. The perfectly square step function exists only in the theoretical limit of the exact mask plane. At any distance away from the mask, such as in the wafer plane, diffraction effects will cause images to exhibit a finite image slope. At small dimensions, that is, when the size and spacing of the images to be printed are small relative to $\lambda/NA$ (NA being the numerical aperture of the exposure system), electric field vectors of nearby images will interact and add constructively. The resulting light intensity curve between features is not completely dark, but exhibits significant amounts of light intensity created by the interaction of adjacent features. The resolution of an exposure system is limited by the contrast of the projected light image, that is the intensity difference between adjacent light and dark features. An increase in the light intensity in nominally dark regions will eventually cause adjacent features to print as one combined structure rather than discrete images.

The quality with which small images can be replicated in lithography depends largely on the available process latitude, that is, the amount of allowable dose and focus variation that still results in correct image size. Phase shifted mask (PSM) lithography improves the lithographic process latitude or allows operation of a lower $k_1$ value (see equation 1) by introducing a third parameter on the mask. The electric field vector, like any vector quantity, has a magnitude and direction, so in addition to turning the electric field amplitude on and off, the phase of the vector can be changed. This phase variation is achieved in PSM's by modifying the length that a light beam travels through the mask material. By recessing the mask by the appropriate depth, light traversing the thinner portion of the mask and light traversing the thicker portion of the mask will be $\pi$ out of phase, that is, their electric field vectors will be of equal magnitude but point in exactly opposite directions so that any interaction between these light beams results in perfect cancellation. Next, a method using phase shift mask to improve the resolution in photolithography is introduced.

FIG. 1(a) shows a cross-sectional view of a conventional mask 10 made of quartz with a circuit design image in chrome 11. This is referred to as a "chrome on glass" or binary mask. FIG. 1(b) shows a graph of the electric field formed on the mask. FIG. 1(c) shows a graph of an electric field on the wafer. FIG. 1(d) shows a graph of the light intensity on the resist film on the wafer.

The minimum dimensions of circuits formed by photolithographic processes generally decrease as improvements in semiconductor manufacturing processes occur. Improving photolithography technology provides improved resolution, resulting in a potential reduction of the minimum dimensions of and spaces between electromagnetic radiation application regions where electromagnetic radiation is applied through the mask.

Recent improvements in photolithographic masks often involve phase shifting techniques, in which certain of the openings, or portions of openings, are phase shifted with respect to adjacent openings.

An example of phase shifting is shown in FIG. 2(a). Phase shifting provides a means by which every other element in a closely packed array of circuit elements is phase shifted which leads to enhancement of the edge contrast. The openings in the mask are typically configured in an array of openings which are phase shifted, and non-phase shifted, along two perpendicular axes of the mask. FIG. 2(a) shows a cross-sectional view of the phase shifting openings 12 and the non-phase shifting openings 13. The electromagnetic radiation that passes through the phase shifting openings interferes destructively in the spaces with the electromagnetic radiation passing through the nonshifting openings, and thereby reduces the intensity of electromagnetic radiation within the unaffected spaces. FIG. 2(b) shows a graph of the electric field on the mask. FIG. 2(c) shows a graph of the electric field on the wafer. FIG. 2(d) shows a graph of the light intensity on the wafer.

Because phase shifting techniques improve the resolution of photolithographic masks in many layout configurations, considerable reticle manufactures now use phase shifting techniques. However, the applications of phase shift mask cannot be employed everywhere, especially when the opening pattern formed on each mask is not regular and repeatable. Moreover, when the increased transistor is designed in the same area of a die, the shrink design rule can not push phase shift mask into mask design. Thus, a soluble method is that only active region accepts phase shift mask, in which active region includes device in integrated circuits. FIG. 3 is a top view showing selective phase shift mask formed on a reticle. Two gate regions 110 passing through an active region 100 appear L-shape. Gate is a polysilicon formed on a substrate and is a main feature in integrated circuits. Because the critical dimension in integrated circuits device is critical, the solution is that only gate through active region applies phase shift mask 120 and 122. Phase shift mask 120 is a region with 0 phase and phase 122 is the phase with π. As to the non-functional devices on a wafer, such as interconnects among devices, or confirmed absence, although they scatter in photolithography, it is not important whether their shape is critical.

Although selective phase shift mask techniques improve gate to shrink less than 0.1 $\mu$m, there is still small critical dimension such as 0.13 $\mu$m iso-line when products becomes or smaller design rule in non-active area. However, product less than 0.13 $\mu$m is hard to print in DUV (Deep UltraViolet). Hence, when applying selective phase shift mask to small design rule is hard.

SUMMARY OF THE INVENTION

In accordance with the present invention, a method is provided for selective phase shift mask with assist optical proximity correction that substantially increases the resolution and process windows in photolithography. The present invention utilizes selective phase shift mask in active region with assist feature outside of active region.

In one embodiment, a phase shift mask for photolithography used in fabricating integrated circuits is disclosed. The mask includes a transparent plate and a first opaque film formed on the transparent plate, which has a first pattern defining a polygate region. The first pattern is then imaged onto a photoresist layer coated on a wafer for the integrated circuits, wherein the width of the gate is equal or less than two third wavelength of the light source in photolithography. The present invention further includes a phase shift region formed on said transparent plate to correspond to an active region of the wafer, in which the phase shift region is used to improve optical scattering effect of the first pattern through the active region while performing the photolithography. Moreover, the present invention has two second opaque films formed on said transparent plate to correspond to a non-active region of the wafer, in which each has at least one second pattern used to improve optical scattering effect of the first pattern through the non-active region while performing the photolithography. The second pattern is located alongside and separated from the first pattern of the opaque film, and wherein the second pattern is then imaged onto the wafer with the phase shift region and the first pattern.

A method for selective phase shift mask with assist optical proximity correction is also provided, in which the mask comprises a transparent plate and a main feature region. The method includes performing phase shift mask correction to the main feature through an active region of a wafer, and performing optical proximity correction to the main feature through a non-active region of the wafer.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Some sample embodiments of the present invention will now be described in greater detail. Nevertheless, it should be recognized that the present invention can be practiced in a wide range of other embodiments besides those explicitly described, and the scope of the present invention is expressly not limited except as specified in the accompanying claims.

Traditional selective phase shift mask can not handle critical dimension out side of active region for it only corrects main feature through active region. The key point of present invention improves file size and process windows in photolithography by using optical proximity correction (OPC) in non-active region. The following will set forth a preferred embodiment with FIG. 4.

Figure 1:
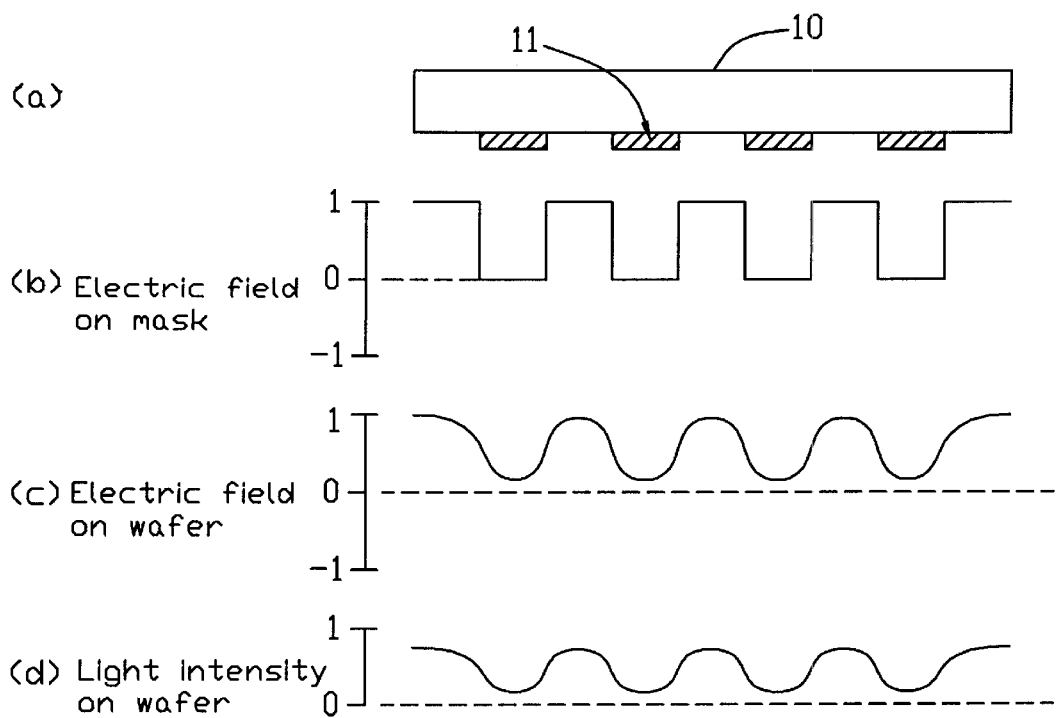
FIG. 1A is a cross-sectional view of a conventional mask.
FIG. 1B is a graph showing an electrical field on the mask when the conventional mask is used.
FIG. 1C is a graph showing an electrical field on the wafer when the conventional mask is used.
FIG. 1D is a graph showing light intensity on the wafer when the conventional mask is used.
Figure 2:
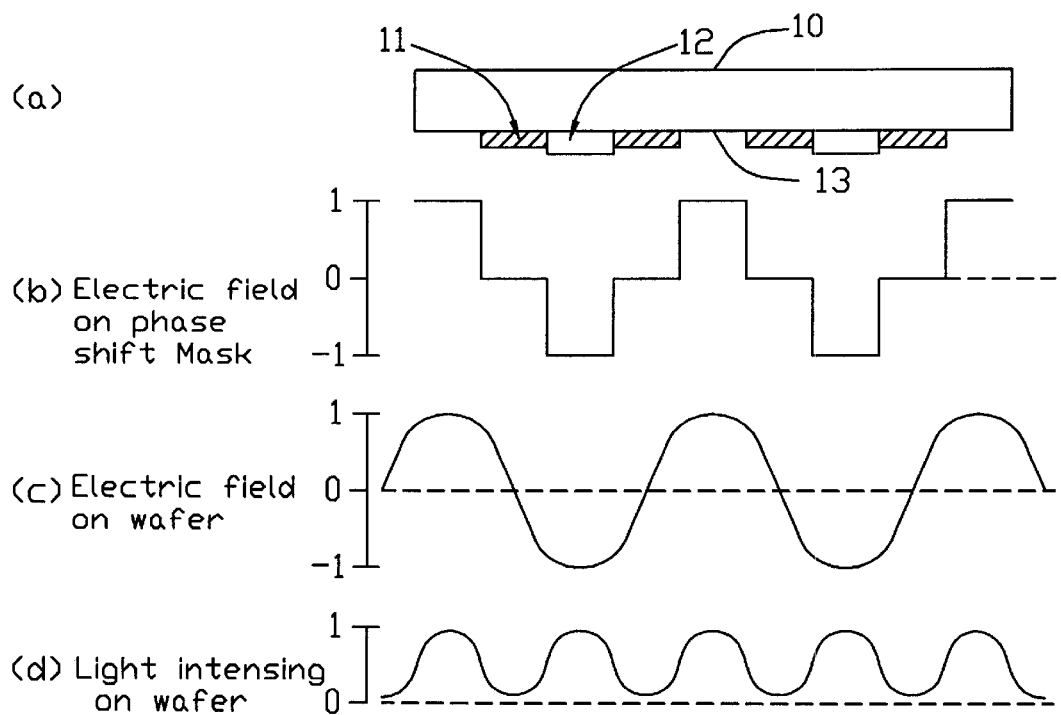
FIG. 2A is a cross-sectional view of a phase shift mask.
FIG. 2B is a graph showing an electrical field on the mask when the phase shift mask is used.
FIG. 2C is a graph showing an electrical field on the wafer when the phase shift mask is used.
FIG. 2D is a graph showing light intensity on the wafer when the phase shift mask is used.
Figure 3:
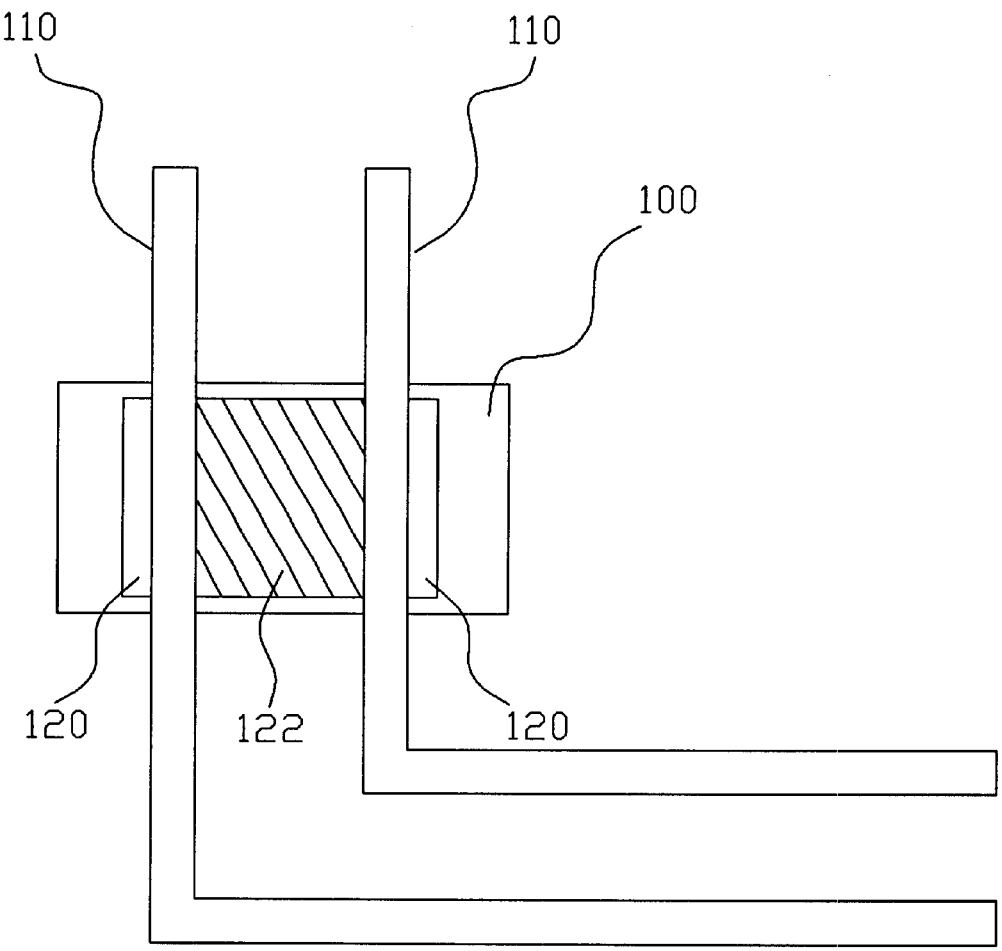
FIG. 3 is a top view of a conventional mask using selective phase shift mask.
Figure 4:
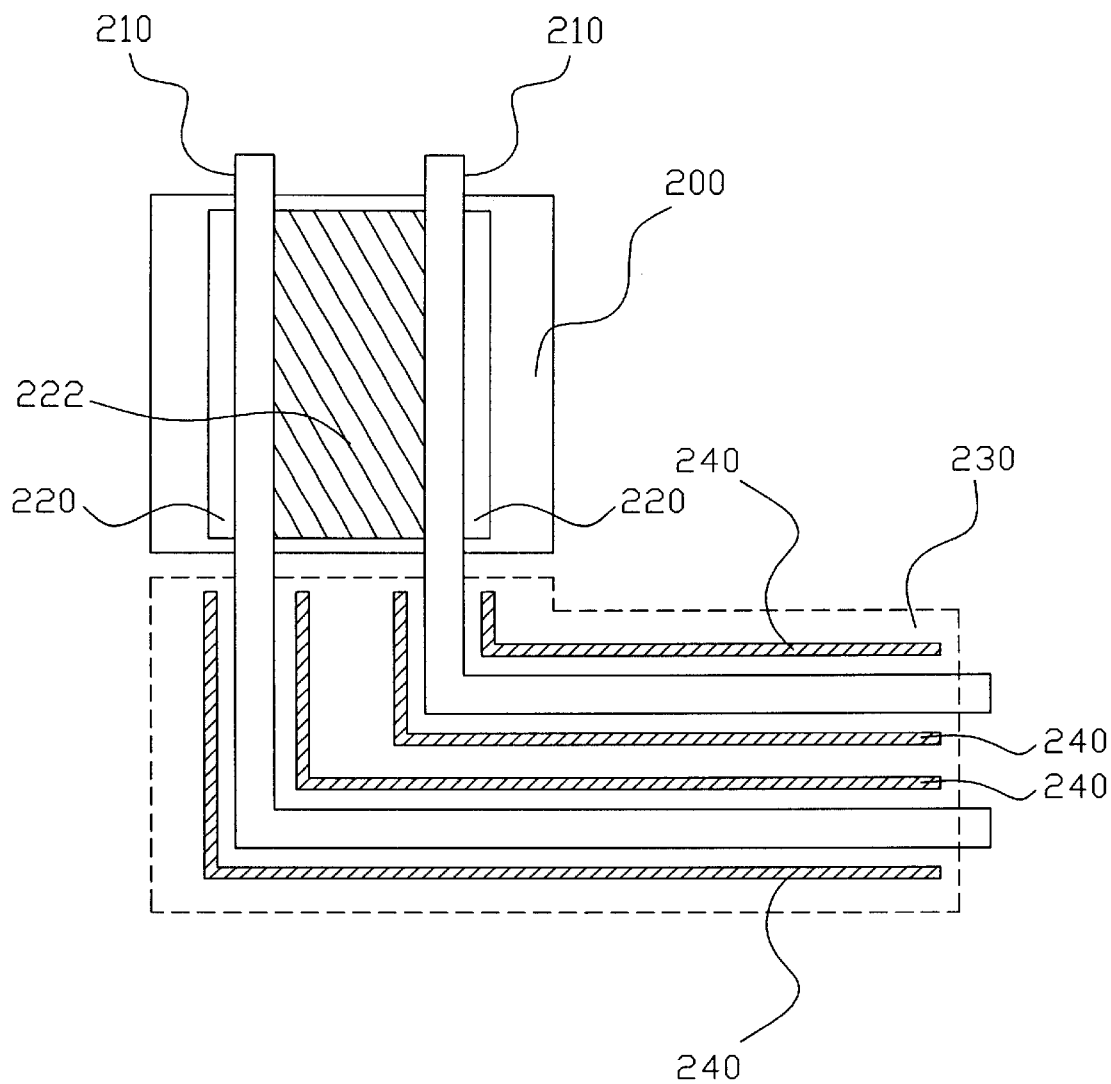
FIG. 4 is a top view of a selective phase shift mask using assist optical proximity correction in accordance with a method disclosed.

FIG. 4 shows a hypothetical arrangement of integrated circuits on a reticle. The reticle is a transparent plate formed by quartz. Main feature 210 passes through an active region 200 and turns a right angle in a non-active region 230. Main feature 210 on the reticle is an opaque pattern coated on the reticle by chrome. The opaque pattern is imaged onto a photoresist layer coated on a wafer in photolithography, and the bottom layer (usually polysilicon layer) is etched with the photoresist stripped to form integrated circuits on the wafer. This formed integrated circuit is ordinarily a gate formed by polysilicon. The width of main feature 210 is important and is equal or less than two-third wavelength of light source in photolithography in this embodiment. Owing to the traditional lithography can not print this feature on a wafer under such width.

Active region 200 and non-active region 230 are on the wafer, not on the reticle. However, these regions as shown in FIG. 4 are used to aid the mask design for the region needs to be fixed in the present invention is main feature passing through active region 200 and non-active region 230. Active region 200 is the place where MOS (metal-oxide-semiconductor) transistor usually is located, and non-active region 230 usually comprises field oxide region or interconnects in integrated circuits.

There are two phase shift regions 220 and 222 in active region 200, wherein phase shift region 220 is 0 phase while phase shift region 222 is π phase. In this embodiment, the method shifting phase in selective phase shift mask (PSM) is alternative PSM.

Referring to FIG. 4, the region enclosed by dash line is a hypothesis non-active region 230, in which two main features 210 pass through. The key point of the present invention is accepting optical proximity correction in the non-active region 230 to improve resolution in optical lithography. The optical proximity correction method is applying at least one scattering bar near main feature. In this embodiment, scattering bars 240 is applied on the two sides of main features 210 in the non-active region 230, as shown in the FIG. The scattering bars 240 are opaque regions formed by coating chrome on the reticle, in which the width of each scattering bars 240 is about 50 nm–90 nm, and separating from one side of main feature 210 is about 200 nm–270 nm in this embodiment, and is based on the DUV exposure tools.

Although specific embodiments have been illustrated and described, it will be obvious to those skilled in the art that various modifications may be made without departing from what is intended to be limited solely by the appended claims.

What is claimed is:

1. A method for fabricating integrated circuits with a phase shift mask, comprising:
   providing a substrate with an active region and a non-active region;
   forming a photoresist layer on said substrate;
   providing a transparent plate, said transparent plate has a main feature that passes through said active region and turns a right angle in said non-active region;
   patterning said main feature onto said photoresist layer by way of using a photolithography, so as to form a plurality of etching masks; and
   performing an etching process by way of using said plurality of etching masks to form integrated circuits on said active region and said non-active region of said substrate.

2. The method according to claim 1, wherein said active region comprises a first phase shift region and a second phase shift region.

3. The method according to claim 2, wherein said first phase shift region comprises a 0 phase.

4. The method according to claim 2, wherein said first phase shift region comprises a π phase.

5. The method according to claim 1, wherein the method for shifting phase comprises a selective phase shift mask.

6. The method according to claim 5, wherein the method for shifting phase in said active region comprises an alternative phase shift mask.

7. The method according to claim 1, wherein the material of said transparent plate comprises a quartz.

8. The method according to claim 1, wherein said main feature on said transparent plate is an opaque pattern.

9. The method according to claim 1, wherein the material of said main feature on said transparent plate comprises a chrome.

10. The method according to claim 1, wherein the width of said main feature is about less than two-third wavelength of light source in said photolithography.

11. The method according to claim 1, wherein the optical proximity correction method is applying at least one scattering bar on the one side of said main features in said non-active region.

12. The method according to claim 11, wherein said scattering bar is an opaque region.

13. The method according to claim 11, wherein the material of said scattering bar comprises a chrome.

14. The method according to claim 11, wherein the width of said scattering bar is about 50 nm to 90 nm.

15. The method according to claim 11, wherein said scattering bar is separated from one side of said main feature about 200 nm–270 nm that is based on a DUV exposure tools.

16. A method for fabricating integrated circuits with a phase shift mask, comprising:
   providing a substrate with an active region and a non-active region;
   forming a photoresist layer on said substrate;
   providing a transparent plate with a main feature that is an opaque pattern, said main feature passes through said active region and turns a right angle in said non-active region, wherein the width of said main feature is about less than two-third wavelength of light source in a photolithography process;
   patterning said main feature onto said photoresist layer by way of using said photolithography process, so as to form a plurality of etching masks; and
   performing an etching process by way of using said plurality of etching masks to form integrated circuits on said active region and said non-active region of said substrate.

17. The method according to claim 16, wherein said active region comprises a first phase shift region with a 0 phase and a second phase shift region with a π phase.

18. The method according to claim 16, wherein the method for shifting phase comprises a selective phase shift mask.

19. The method according to claim 18, wherein the method for shifting phase in said active region comprises an alternative phase shift mask.

20. The method according to claim 16, wherein the material of said transparent plate comprises a quartz.

21. The method according to claim 16, wherein the material of said main feature on said transparent plate comprises a chrome.

22. The method according to claim 16, wherein the optical proximity correction method is applying at least one scattering bar that is an opaque region on the one side of said main features in said non-active region.

23. The method according to claim 22, wherein the material of said scattering bar comprises a chrome.

24. The method according to claim 22, wherein the width of said scattering bar is about 50 nm to 90 nm.

25. The method according to claim 22, wherein said scattering bar is separated from one side of said main feature about 200 nm to 270 nm that is based on a DUV exposure tools.

26. A method for forming a plurality of gates with a phase shift mask, comprising:
   providing a substrate with an active region and a non-active region;
   forming a polysilicon layer on said substrate;

forming a photoresist layer on said polysilicon layer;

providing a transparent plate that is a quartz material with a plurality of main features and a plurality of scattering bars, said plurality of main features are a plurality of opaque patterns and pass through said active region and turn a right angle in said non-active region, said plurality of scattering bars are a plurality of opaque regions on the two sides of said plurality of main features in said non-active region, wherein the widths of said plurality of main feature are about less than two-third wavelength of light source in a photolithography process, and the width of said plurality of scattering bars is about 50 nm to 90 nm;

patterning said plurality of main feature onto said photoresist layer by way of using said photolithography process, so as to form a plurality of etching masks; and performing an etching process by way of using said plurality of etching masks to etch said polysilicon layer, so as to form a plurality of polysilicon gates on said active region and said non-active region of said substrate.

27. The method according to claim 26, wherein said active region comprises a first phase shift region with a 0 phase and a second phase shift region with a $\pi$ phase.

28. The method according to claim 26, wherein the method for shifting phase comprises a selective phase shift mask.

29. The method according to claim 26, wherein the method for shifting phase in said active region comprises an alternative phase shift mask.

30. The method according to claim 26, wherein the material of said plurality of main feature on said transparent plate comprises a chrome.

31. The method according to claim 26, wherein the material of said scattering bar comprises a chrome.

32. The method according to claim 26, wherein said plurality of scattering bars are separated from one side of said plurality of main features about 200 nm to 270 nm that is based on a DUV exposure tools.

* * * * *